US010923625B2

United States Patent
Na et al.

(10) Patent No.: US 10,923,625 B2
(45) Date of Patent: Feb. 16, 2021

(54) MULTI-WAVELENGTH LIGHT SOURCE DEVICE, MULTI-FUNCTION PROJECTOR INCLUDING THE SAME, AND ELECTRONIC DEVICE INCLUDING THE MULTI-FUNCTION PROJECTOR

(71) Applicant: SAMSUNG ELECTRONICS CO., LTD., Suwon-si (KR)

(72) Inventors: Byunghoon Na, Suwon-si (KR); Jangwoo You, Seoul (KR); Seunghoon Han, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 136 days.

(21) Appl. No.: 16/196,098

(22) Filed: Nov. 20, 2018

(65) Prior Publication Data

US 2019/0371965 A1    Dec. 5, 2019

(30) Foreign Application Priority Data

Jun. 5, 2018 (KR) .................... 10-2018-0064909

(51) Int. Cl.
*G06K 9/00* (2006.01)
*H01L 33/08* (2010.01)
(Continued)

(52) U.S. Cl.
CPC .......... *H01L 33/08* (2013.01); *G06K 9/00288* (2013.01); *G06K 9/00617* (2013.01);
(Continued)

(58) Field of Classification Search
CPC ....... H01L 33/08; H01L 27/156; H01L 33/06; H01L 33/10; G06T 7/521; G06K 9/00288; G06K 9/00617; G06K 9/00892
See application file for complete search history.

(56) References Cited

U.S. PATENT DOCUMENTS 8,374,404 B2 * 2/2013 Williams ........... G06K 9/00604
                                                        382/117
9,806,229 B2 * 10/2017 Kashima ............. H01L 33/0075
(Continued)

FOREIGN PATENT DOCUMENTS

EP      2 942 818 A1    11/2015
EP      2942818 B1 *    11/2015   ......... H01L 33/0025
(Continued)

OTHER PUBLICATIONS

Monolithic GaAlAs/GaGs—Amplification, Heinz Beneking et al., IEEE 0018-9383, Apr. 1981, pp. 404-407 (Year: 1981).*
(Continued)

*Primary Examiner* — Jayesh A Patel
(74) *Attorney, Agent, or Firm* — Sughrue Mion, PLLC

(57) ABSTRACT

Provided is a light source device including a substrate, a first light emitting element disposed on the substrate and including a first reflective layer, a second light emitting layer configured to emit light of a second wavelength, a first etch stop layer, a first light emitting layer configured to emit light of a first wavelength different from the second wavelength, and a first nanostructure reflective layer, and a second light emitting element disposed on the substrate, spaced apart from the first light emitting element, and comprising a second reflective layer having same material and thickness as the first reflective layer, a third light emitting layer having same material and structure as the second emitting layer and configured to generate light of the second wavelength, a second etch stop layer having same material and thickness as the first etch stop layer, and a second nanostructure reflective layer.

23 Claims, 13 Drawing Sheets

(51) Int. Cl.
*G06T 7/521* (2017.01)
*H01L 27/15* (2006.01)
*H01L 33/06* (2010.01)
*H01L 33/10* (2010.01)

(52) U.S. Cl.
CPC .......... *G06K 9/00892* (2013.01); *G06T 7/521* (2017.01); *H01L 27/156* (2013.01); *H01L 33/06* (2013.01); *H01L 33/10* (2013.01)

(56) References Cited

U.S. PATENT DOCUMENTS

| | | | |
|---|---|---|---|
| 10,049,272 B2* | 8/2018 | Agrawal | G06F 21/32 |
| 2003/0160251 A1* | 8/2003 | Wanlass | H01L 31/0475 |
| | | | 257/80 |
| 2004/0170304 A1* | 9/2004 | Haven | A61B 5/163 |
| | | | 382/115 |
| 2009/0078955 A1* | 3/2009 | Fan | H01L 27/15 |
| | | | 257/98 |
| 2014/0077221 A1* | 3/2014 | Genei | H01L 33/0025 |
| | | | 257/76 |
| 2016/0307939 A1* | 10/2016 | Wang | H04B 10/40 |
| 2017/0025567 A1* | 1/2017 | Lu | H01L 27/153 |
| 2017/0093128 A1 | 3/2017 | Fattal et al. | |
| 2017/0213808 A1* | 7/2017 | Pan | H01L 23/49506 |
| 2017/0213868 A1 | 7/2017 | Damilano et al. | |
| 2017/0287151 A1 | 10/2017 | Han et al. | |
| 2018/0034242 A1* | 2/2018 | Mathai | H01S 5/18358 |

FOREIGN PATENT DOCUMENTS

| | | | | |
|---|---|---|---|---|
| EP | 2942818 B1 * | 1/2018 | | H01L 33/0075 |
| KR | 10-2017-0112915 A | 10/2017 | | |
| WO | 2007/037617 A1 | 4/2007 | | |

OTHER PUBLICATIONS

Communication dated May 31, 2019, issued by the European Patent Office in counterpart European Application No. 18207103.5.

* cited by examiner

MULTI-WAVELENGTH LIGHT SOURCE DEVICE, MULTI-FUNCTION PROJECTOR INCLUDING THE SAME, AND ELECTRONIC DEVICE INCLUDING THE MULTI-FUNCTION PROJECTOR

CROSS-REFERENCE TO RELATED APPLICATION

This application claims priority from Korean Patent Application No. 10-2018-0064909, filed on Jun. 5, 2018 in the Korean Intellectual Property Office, the disclosure of which is incorporated herein in its entirety by reference.

BACKGROUND

1. Field

Example embodiments of the present disclosure relate to a multi-wavelength light source device, a multi-function projector including the same, and an electronic device including the multi-function projector.

2. Description of the Related Art

Various sensors such as iris sensors or depth sensors are used in mobile and wearable devices. Also, there has been a continuing trend of reducing the sizes and power consumption of sensors used in fields such as tablets, personal computers, drones, or Internet of Things (IoT).

Existing sensors use micro-optical techniques according to their functions and include illumination components necessary for projectors or scanners. Therefore, many light sources and optical components are required, and the increase in volume occupied by such optical components is a factor affecting the design precision and manufacturing conditions of sensors.

SUMMARY

Provided are light source devices for emitting light in a multi-wavelength band.

Provided are multi-function projectors including the light source devices and electronic devices including the multi-function projectors.

Additional aspects will be set forth in part in the description which follows and, in part, will be apparent from the description, or may be learned by practice of the example embodiments.

According to an aspect of an example embodiment, there is provided a light source device including a substrate, a first light emitting element disposed on the substrate and including a first reflective layer, a second light emitting layer configured to emit light of a second wavelength, a first etch stop layer, a first light emitting layer configured to emit light of a first wavelength, the first wavelength being different from the second wavelength, and a first nanostructure reflective layer, and a second light emitting element disposed on the substrate, spaced apart from the first light emitting element, and including a second reflective layer having same material and thickness as the first reflective layer, a third light emitting layer having same material and structure as the second emitting layer, the third light emitting layer being configured to generate light of the second wavelength, a second etch stop layer having same material and thickness as the first etch stop layer, and a second nanostructure reflective layer.

The light source device may have a monolithic structure.

The first wavelength may be greater than the second wavelength.

The first light emitting layer and the second light emitting layer may have a quantum well structure, respectively, wherein a band gap energy of the quantum well structure of the first light emitting layer is less than a band gap energy of the quantum well structure of the second light emitting layer.

The first light emitting element may be configured to emit the light of the first wavelength based on a distance between the first reflective layer and the first nanostructure reflective layer.

The distance between the first reflective layer and the first nanostructure reflective layer may be a first integer multiple of the first wavelength.

The distance between the second reflective layer and the second nanostructure reflective layer may be a second integer multiple of the second wavelength.

The first integer may be greater than the second integer.

The difference between the first wavelength and the second wavelength may be 50 nm or more.

The light source device, wherein the first wavelength may be in an infrared wavelength band, and wherein the second wavelength may be in a visible light wavelength band.

The first light emitting element and the second light emitting element may emit lights of different polarizations, respectively.

The first nanostructure reflective layer may include a plurality of first nanostructures having a shape with sub-wavelength dimensions with respect to the first wavelength, the sub-wavelength being less than the first wavelength.

The second nanostructure reflective layer may include a plurality of second nanostructures having a shape with sub-wavelength dimensions with respect to the light of the second wavelength, the sub-wavelength being less than the second wavelength.

The light source device, wherein the first light emitting element may be disposed along a first plurality of rows spaced apart from and parallel with each other, and wherein the second light emitting element may be disposed along a second plurality of rows, the second plurality of rows alternating with the first plurality of rows.

According to an aspect of an example embodiment, there is provided a multi-function projector including the light source device, a controller configured to control the light source device to selectively drive the first light emitting element and the second light emitting element, and a nanostructure light modulation layer disposed on an optical path of light emitted from the light source device, including a plurality of nanostructures having a shape with sub-wavelength dimensions, the sub-wavelength being less than a wavelength of the light emitted from the light source device, and configured to modulate the light emitted from the light source device.

The nanostructure light modulation layer may be configured to modulate light emitted from the first light emitting element differently from light emitted from the second light emitting element.

The first light emitting element and the second light emitting element may be configured to emit lights of different polarizations, respectively.

The nanostructure light modulation layer may be configured to modulate light emitted from the first light emitting element into predetermined structured light, and modulate light emitted from the second light emitting element into uniform light.

The plurality of nanostructures of the nanostructure light modulation layer may have asymmetrical cross-sectional shapes.

According to an aspect of an example embodiment, there is provided an electronic device including the multi-function projector, wherein the multi-function projector is configured to emit light to an object, a sensor configured to receive light reflected from the object, and a processor configured to determine shape information of the object based on the light received by the sensor.

The processor may be configured to perform different determinations based on a wavelength of the light emitted from the multi-function projector.

The multi-function projector may be configured to emit structured light onto the object based on the light emitted from the first light emitting element and to emit uniform light onto the object based on the light emitted from the second light emitting element.

The processor may be configured to use a face recognition method for user authentication based on the multi-function projector emitting the structured light onto the object, and use an iris recognition method for user authentication based on the multi-function projector emitting the uniform light onto the object.

According to an aspect of an example embodiment, there is provided a multi-function projector including a light source device including a substrate, a first light emitting element disposed on the substrate including a first reflective layer, a second light emitting layer configured to emit light of a second wavelength, a first light emitting layer configured to emit light of a first wavelength, the first wavelength being different from the second wavelength, and a first nanostructure reflective layer, and a second light emitting element disposed on the substrate, spaced apart from the first light emitting element, and including a second reflective layer, a third light emitting layer having same material and structure as the second emitting layer, the third light emitting layer being configured to generate light of the second wavelength, a second nanostructure reflective layer, a controller configured to control the light source device to selectively drive the first light emitting element and the second light emitting element, and a nanostructure light modulation layer including a plurality of nanostructures, the nanostructure light modulation layer being configured to differently modulate at least one of an intensity and a phase of the light of the first wavelength and at least one of an intensity and a phase of the light of the second wavelength, respectively.

The nanostructure light modulation layer may be further configured to modulate the at least one of the intensity and the phase of light of the first wavelength and the at least one of the intensity and the phase of the light of the second wavelength, respectively, based on a shape and a position of each of the plurality of nanostructures.

The nanostructure light modulation layer may be further configured to modulate the light of the first wavelength into a structured light and the light of the second wavelength into a uniform light based on the shape and the position of the plurality of nanostructures.

The first light emitting element may be configured to emit the light of the first wavelength based on a first distance between the first reflective layer and the first nanostructure reflective layer, and wherein the third light emitting element may be configured to emit the light of the second wavelength based on a second distance between the second reflective layer and the second nanostructure reflective layer.

BRIEF DESCRIPTION OF THE DRAWINGS

The above and other aspects will become apparent and more readily appreciated from the following description of the example embodiments, taken in conjunction with the accompanying drawings in which.

DETAILED DESCRIPTION

Figure 1:
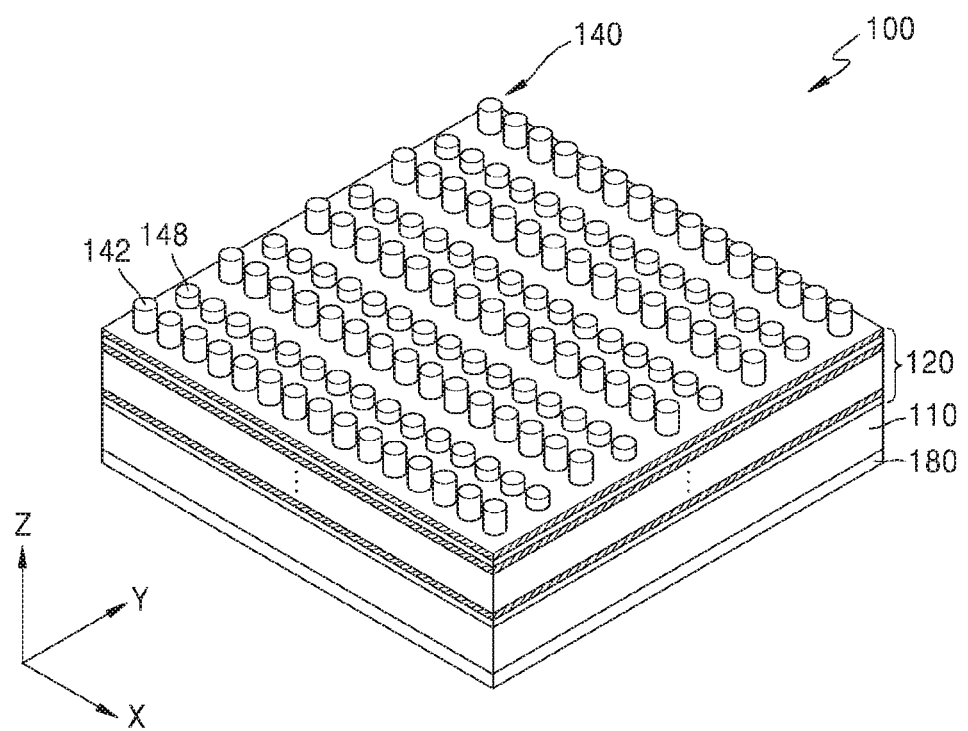
FIG. 1 is a perspective view illustrating a schematic configuration of a light source device according to an example embodiment.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

In the following description, when an element is referred to as being "above" or "on" another element, it may be directly on the other element while making contact with the other element or may be above the other element without making contact with the other element.

Although the terms "first" and "second" are used to describe various elements, these terms are only used to distinguish one element from another element. These terms do not limit elements to having different materials or structures.

It will be further understood that the terms "comprises" and/or "comprising" used herein specify the presence of stated features or elements, but do not preclude the presence or addition of one or more other features or elements.

In the present disclosure, terms such as unit or module are used to denote a unit that has at least one function or operation and is implemented as hardware, software, or a combination of hardware and software.

The operations described in the example embodiments are examples which are not intended to limit the scope of the present disclosure. In the present disclosure, descriptions of known electric components, control systems, software, and other functional aspects thereof may not be given for conciseness. Furthermore, in the drawings, connection lines or members between elements are example functional, physical, and/or electric connections that may be replaced with or used together with other functional, physical, and/or electrical connections.

An element referred to with the definite article or a demonstrative pronoun may be construed as the element or the elements even though it has a singular form.

Operations of a method may be performed in appropriate order unless explicitly described in terms of order or described to the contrary. Also, examples or exemplary terms (for example, "such as" and "etc.") are used for the purpose of description and are not intended to limit the scope of the present disclosure unless defined by the claims.

Figure 2:
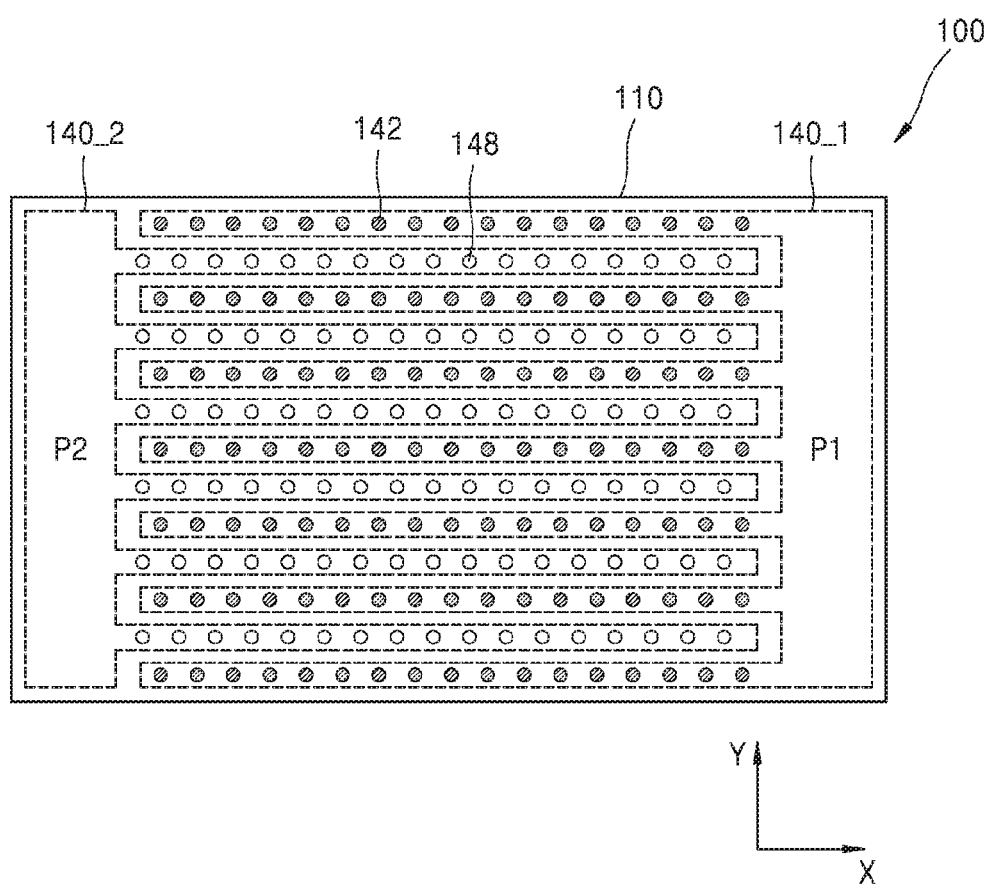
FIG. 2 is a plan view illustrating an arrangement of a plurality of light emitting elements included in the light source device shown in FIG. 1.

FIG. 1 is a perspective view illustrating a schematic configuration of a light source device 100 according to an example embodiment. FIG. 2 is a plan view illustrating an arrangement of a plurality of light emitting elements included in the light source device 100 shown in FIG. 1.

The light source device 100 may include a light source array 140 formed on a substrate and configured to emit light of a plurality of wavelengths. The light source array 140 may include a plurality of first light emitting elements 142 and a plurality of second light emitting elements 148. The first light emitting element 142 and the second light emitting element 148 may be configured to emit lights of different wavelengths, respectively. The first light emitting element 142 and the second light emitting element 148 may be configured to emit light of different polarizations, respectively. The substrate may include a semiconductor substrate 110 and a reflection layer 120 including a semiconductor based material. The reflective layer 120 may be a distributed Bragg reflector including a plurality of layers stacked alternately and having different refractive indices. The reflective layer 120 may operate as a lower mirror common with respect to the first light emitting element 142 and the second light emitting element 148. However, this is merely an example, and the first light emitting element 142 and the second light emitting element 148 may be provided with separate reflective layers. A lower electrode 180 may be disposed on a lower surface of the semiconductor substrate 110 opposite to the reflective layer 120. The lower electrode 180 may be an electrode injecting current into the first light emitting element 142 and the second light emitting element 148 along with an upper electrode provided in each of the first light emitting element 142 and the second light emitting element 148. However, a position of the lower electrode 180 is not limited thereto and may be changed.

The light source device 100 may have a structure in which the first light emitting element 142 and the second light emitting element 148 that respectively emits light of different wavelengths are monolithically formed on the same substrate. For example, the first light emitting element 142 and the second light emitting element 148 may be manufactured according to a series of processes that are continuously performed on the same substrate, and separate manufacturing processes and transferring or bonding are not accompanied. For example, various material layers may be stacked by using a method such as vapor deposition, and manufactured according to a series of processes such as a photolithography process including exposure, developing, and etching for forming a pattern.

The light source device 100 may have a configuration in which light of different wavelengths may be selectively emitted. The first light emitting elements 142 may be arranged to form a plurality of rows of first light emitting arrays 140_1 that are parallel with and spaced apart from one another as shown in FIG. 2. The second light emitting elements 148 may be arranged to form a plurality of rows of second light emitting arrays 140_2 that are parallel with and spaced apart from one another. The plurality of rows of first light emitting arrays 140_1 may alternate with the plurality of rows of second light emitting arrays 140_2.

The first light emitting array 140_1 and the second light emitting array 140_2 may be controlled independently from each other. The first light emitting array 140_1 may be driven by a control signal P1. The second light emitting array 140_2 may be driven by a control signal P2. The first light emitting array 140_1 may emit light while the second light emitting array 140_2 does not emit light, or the second light emitting array 140_2 may emit light while the first light emitting array 140_1 does not emit light.

When the first light emitting array 140_1 and the second light emitting array 140_2 are controlled independently from each other, not all of the first light emitting elements 142 of the first light emitting array 140_1 may be driven simultaneously or not all of the second light emitting elements 148 of the second light emitting array 140_2 may be driven simultaneously. For example, when the first light emitting array 140_1 is driven, the first light emitting elements 142 may be sequentially driven so that columns of the first light emitting elements 142 emit light in a scanning manner, from the first row of a column to the last row of the column. The first light emitting elements 142 may be sequentially driven in other manners. When the second light emitting array 140_2 is driven, the second light emitting elements 148 may be sequentially driven so that columns of the second light emitting elements 148 emit light in a scanning manner. However, example embodiments are not limited thereto, and the second light emitting elements 148 may be sequentially driven in other manners.

The arrangement of the first light emitting element 142 and the second light emitting element 148 is not limited to arrangement described above. For example, the arrangement may have a random distribution. The first light emitting array 140_1 and the second light emitting array 140_2 may be controlled independently from each other and when any one of the first light emitting array 140_1 and the second light emitting array 140_2 is driven, various arrangements may be employed so that a distribution of the emitted light is substantially spatially uniform.

Figure 3A:
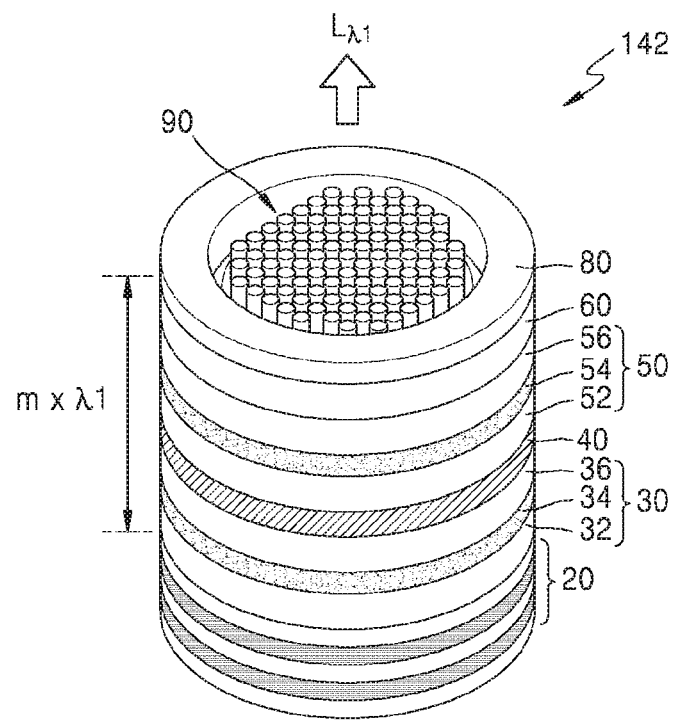
FIGS. 3A and 3B are respectively a detailed perspective view and a cross-sectional view showing a first light emitting element provided in the light source device of FIG. 1.
Figure 3B:
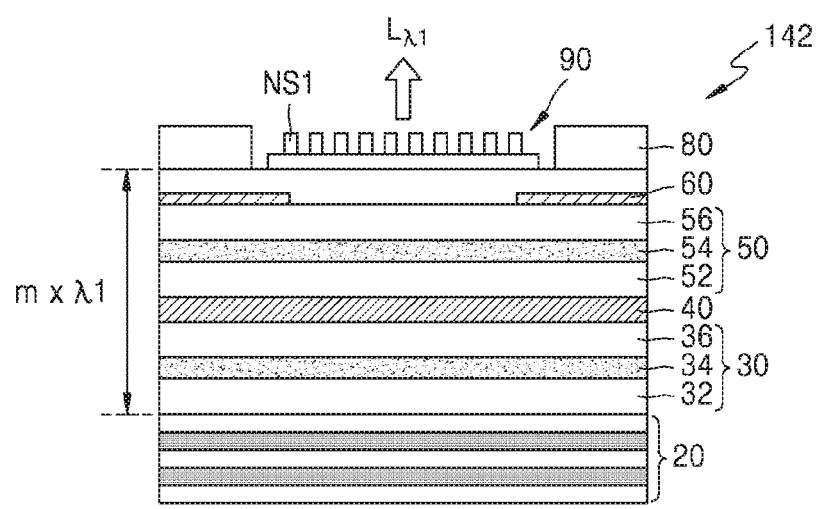
Figure 4:
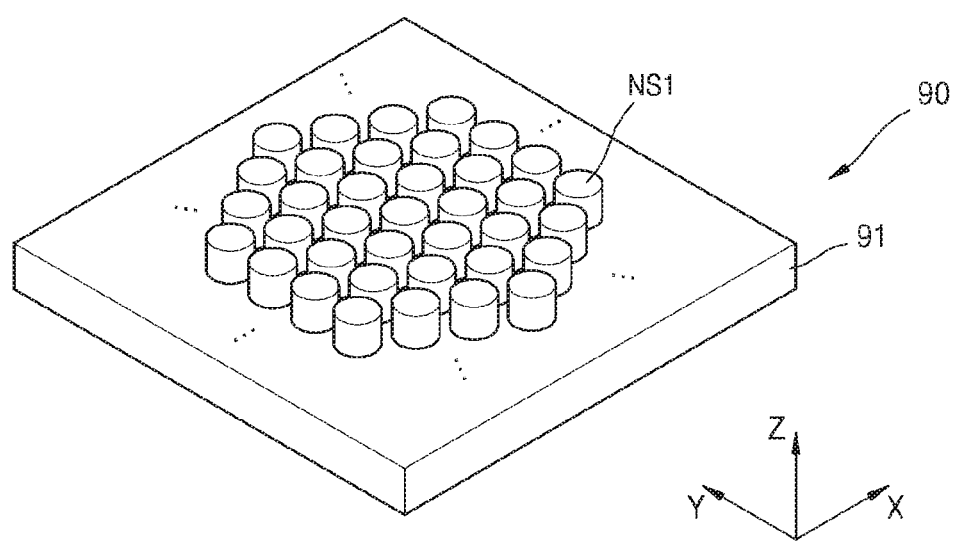
FIG. 4 shows an example structure of a first nanostructure reflective layer provided in the first light emitting element of the light source device of FIG. 1.

FIGS. 3A and 3B are respectively a perspective view and a cross-sectional view showing the first light emitting element 142 provided in the light source device 100 of FIG. 1. FIG. 4 shows an example structure of a first nanostructure reflective layer provided in the first light emitting element 142 of the light source device 100 of FIGS. 3A and 3B.

The first light emitting element 142 may have a configuration similar to that of a vertical cavity surface emitting laser (VCSEL).

The first light emitting element 142 may include a first reflective layer 20, a second light emitting layer 30 configured to generate light of a second wavelength, a first etch stop layer 40, a first light emitting layer 50 configured to emit light of a first wavelength different from the second wavelength, and a first nanostructure reflective layer 90. The second light emitting layer 30, the first etch stop layer 40, the first light emitting layer 50, and the first nanostructure reflective layer 90 may be sequentially arranged from the bottom toward the top of the first light emitting element 142.

The second light emitting layer 30 may absorb energy and generate light. For example, the second light emitting layer 30 may generate light when current is injected into the second light emitting layer 30 or pumping light is cast onto the second light emitting layer 30. The second light emitting layer 30 may include a second active layer 34 including a semiconductor material. For example, the second active layer 34 may include a group III-V semiconductor material or a group II-VI semiconductor material. The second active layer 34 may have a multi-quantum well structure containing indium gallium arsenide (InGaAs), aluminium gallium arsenide (AlGaAs), aluminium gallium nitride (AlGaN), indium gallium arsenic phosphide (InGaAsP), indium gallium phosphide (InGaP), aluminium gallium indium phosphide (AlGaInP), or the like. The second active layer 34 may include quantum dots. However, the material that may be included in the second active layer 34 is not limited to the listed materials. The second active layer 34 may have a material and a structure for emitting the light of the second wavelength.

The second light emitting layer 30 may further include a second upper clad layer 36 and a second lower clad layer 32 that are respectively arranged above and below the second active layer 34. Each of the second upper clad layer 36 and the second lower clad layer 32 may include an N-type, P-type, or intrinsic semiconductor material. The second upper clad layer 36 and the second lower clad layer 32 may include a semiconductor material that is the same as or different from that included in the second active layer 34 and may further include a N-type dopant and a P-type dopant, respectively.

The first light emitting layer 50 may be a layer absorbing energy and generating light and may be configured to emit light of a different wavelength from that of the second light emitting layer 30. The first light emitting layer 50 may include a first active layer 54 including a semiconductor material. For example, similar to the second active layer 34, the first active layer 54 may include a group III-V semiconductor material or a group II-VI semiconductor material and may have a multi-quantum well structure containing InGaAs, AlGaAs, AlGaN, InGaAsP, InGaP, AlGaInP, or the like. The first active layer 54 may include quantum dots. However, the material that may be included in the first active layer 54 is not limited to the listed materials. The first active layer 54 may have a material and a structure for emitting the light of the first wavelength longer than the second wavelength emitted by the second active layer 34. For example, the first active layer 54 may include a material and have a structure to emit light of an infrared band. The band gap energy of the quantum well structure employed in the first active layer 54 may be lower than the band gap energy of the quantum well structure employed in the second active layer 34.

The first light emitting layer 50 may further include a first upper clad layer 56 and a first lower clad layer 52 that are respectively arranged above and below the first active layer 54. Each of the first upper clad layer 56 and the first lower clad layer 52 may include an N-type, P-type, or intrinsic semiconductor material. The first upper clad layer 56 and the first lower clad layer 52 may include a semiconductor material that is the same as or different from that included in the first active layer 54 and may further include a N-type dopant and a P-type dopant, respectively.

The first etch stop layer 40 may be disposed between the second light emitting layer 30 and the first light emitting layer 50. The first etch stop layer 40 may be provided according to more easily manufacture the first light emitting element 142 and the second light emitting element 148 formed on the same substrate as that of the first light emitting element 142. The first etch stop layer 40 may include a semiconductor material and may include a material having a different etch ratio from the first light emitting layer 50 disposed above the first etch stop layer 40.

The first light emitting element 142 may include an oxide aperture layer 60. The oxide aperture layer 60 may adjust the mode or beam size of oscillating light. The oxide aperture layer 60 is illustrated as being above the first light emitting layer 50. However, the position of the oxide aperture layer 60 is not limited thereto. For example, the oxide aperture layer 60 may be located inside the first reflective layer 20 in the lower portion of the second light emitting layer 30. Also, a plurality of oxide aperture layers 60 may be provided, or no oxide aperture layer 60 may be provided. The second electrode 80 for injecting current into the first light emitting layer 50 may be disposed above the oxide aperture layer 60.

The first reflective layer 20 formed on the lower portion of the second light emitting layer 30 and the first nanostructure reflective layer 90 formed on the upper portion of the first light emitting layer 50, respectively, may form a resonance cavity with respect to light generated in the first light emitting layer 50. That is, the first reflective layer 20 and the first nanostructure reflective layer 90 may be provided to oscillate the light generated in the first active layer 54 and amplify and emit light $L_{\lambda 1}$ of the first wavelength. The thickness from the top of the first reflective layer 20 to the first nanostructure reflective layer 90 may be an integer m multiple of a first wavelength $\lambda 1$.

The first reflective layer 20 may be a distributed Bragg reflector like the reflective layer 120 formed on the semiconductor substrate 110 of FIG. 1. That is, the first reflective layer 20 may have a structure in which a plurality of layers having different refractive indices are alternately stacked. The thickness of each of the plurality of layers having different refractive indices may be about ¼ of a predetermined oscillation wavelength. The thickness may be an odd multiple (e.g., ¾, 5/4, . . . ) of ¼ of the oscillation wavelength. Such a distributed Bragg reflector may set the reflectance to a predetermined value by adjusting the refractive index difference of the two material layers and the number of times the pair is repeatedly stacked. The first reflective layer 20 may include the same material as the semiconductor material forming the first and second light emitting layers 50 and 30. For example, one of the two material layers may be a layer of $Al_xGa_{(1-x)}As$ ($0 \leq x \leq 1$) and the other may be a layer of $Al_yGa_{(1-y)}As$ ($0 \leq y \leq 1$, $x \neq y$). The first reflective layer 20 may be doped to have the same semiconductor type as that of the second lower clad layer 32 of the second light emitting layer 30. For example, when the second lower clad layer 32 is P type, the first reflective layer 20 may be doped with P type, and when the second lower clad layer 32 is N type, the first reflective layer 20 may be doped with N type. The material of the first reflective layer 20 is not limited thereto, and various materials capable of forming the refractive index difference may be used.

In the distributed Bragg reflector, the reflectance increases as the number of stacked layers increases. Therefore, the total number of stacked layers of the reflective layer 120 of FIG. 1 and the first reflective layer 20 may be determined such that, for example, a reflectivity of about 90% or more may be implemented. By adjusting the reflectance, a direction in which light is emitted may be adjusted. Light may be emitted through the upper first nanostructure reflective layer 90 with the reflectance of the reflective layer 120 of FIG. 1 and the first reflective layer 20 at about 98% or higher.

The first nanostructure reflective layer 90 may be configured to implement a predetermined reflectance at a small thickness instead of a distributed Bragg reflector structure having a relatively large thickness due to a large number of stacked layers. Accordingly, the thickness of the first light emitting element 142 may be reduced and it may reduce the entire volume of the light source device 100.

The first nanostructure reflective layer 90 may include a plurality of nanostructures NS1 having a sub-wavelength shape dimension. As shown in FIG. 4, the nanostructures NS1 may be provided on a support layer 91. The sub-wavelength shape dimension is a dimension such as a thickness or a width defining the shape of the nanostructures NS1 being less than a wavelength of light emitted from the first light emitting element 142, i.e. the first wavelength λ1 that is a wavelength of light generated in the first active layer 54.

The first nanostructure reflective layer 90 may include a semiconductor material. For example, the first nanostructure reflective layer 90 may be entirely formed of a III-V group semiconductor compound. Also, the composition of the compound may be adjusted to set the refractive index of the support layer 91 to be less than the refractive index of the nanostructures NS1. The refractive index difference between the support layer 91 and the nanostructures NS1 may be about 0.5 or greater, or about 1 or greater.

The thickness of the support layer 91 may be set to be equal to or greater than 1/5 of an emission wavelength, i.e., the first wavelength λ1. When the thickness of the support layer 91 is less than 1/5 of the emission wavelength, light resonating at the nanostructures NS1 above the support layer 91 may be coupled to a lower layer of a semiconductor material, and thus a predetermined operation as a meta-structure may not be performed.

The first light emitting element 142 may further include a heat sink for emitting heat generated in the first light emitting layer 50 and the second light emitting layer 30. The heat sink may include a metal material having a relatively high thermal conductivity, for example, copper, gold, aluminum, or the like, and may be formed in a shape surrounding a side surface of the first light emitting element 142.

When current is injected into the first active layer 54 and the second active layer 34 through the lower electrode 180 FIG. 1 disposed on a lower portion of the second light emitting layer 30 and the second electrode 80 disposed on an upper portion of the first light emitting layer 50, light $L_{\lambda 1}$ of the first wavelength λ1 and light $L_{\lambda 2}$ of the second wavelength λ2 may be respectively generated. The light $L_{\lambda 1}$ of the first wavelength λ1 may be amplified since the light $L_{\lambda 1}$ of the first wavelength λ1 meets the resonance condition of the cavity, while the light $L_{\lambda 2}$ of the second wavelength λ2 may not be emitted since the light $L_{\lambda 2}$ of the second wavelength λ2 is absorbed in a structure in the cavity. According to the above process, the light $L_{\lambda 1}$ of the first wavelength λ1 may be emitted from the first light emitting element 142.

Figure 5A:
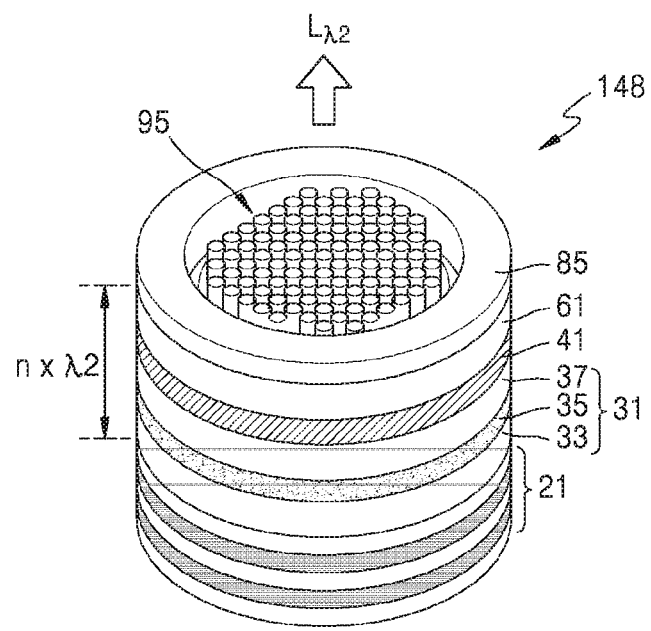
FIGS. 5A and 5B are respectively a detailed perspective view and a cross-sectional view showing a second light emitting element provided in the light source device of FIG. 1.
Figure 5B:
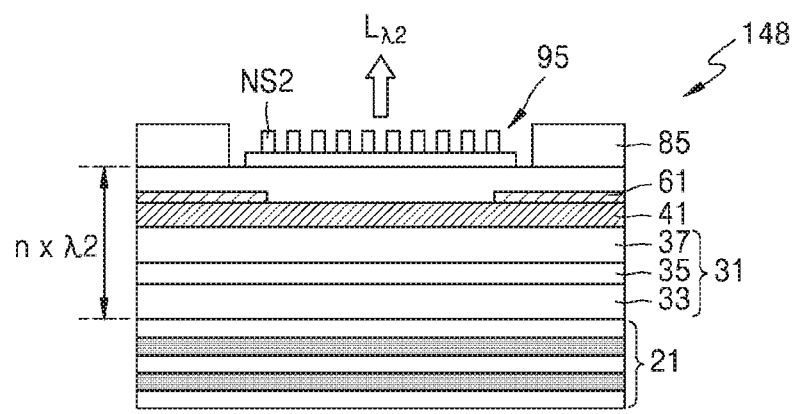
Figure 6:
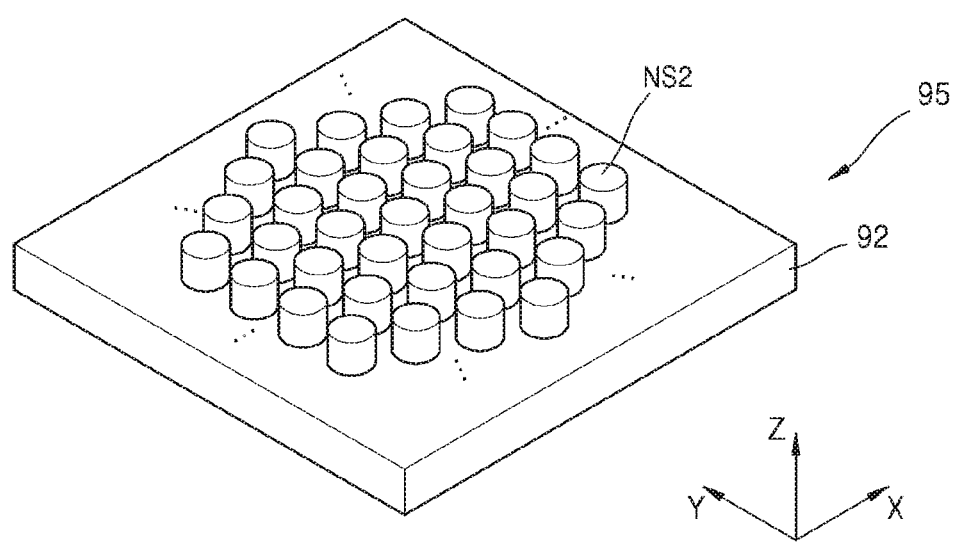
FIG. 6 shows an example structure of a second nanostructure reflective layer provided in the second light emitting element of the light source device of FIG. 1.

FIGS. 5A and 5B are detailed perspective and cross-sectional views showing the second light emitting element 148 provided in the light source device 100 of FIG. 1, respectively. FIG. 6 shows an example structure of a second nanostructure reflective layer provided in the second light emitting element 148 of the light source device 100 of FIG. 1.

The second light emitting element 148 may include the second reflective layer 21, a third light emitting layer 31, and a second etch stop layer 41. The second reflective layer 21 may have the same material and thickness as the first reflective layer 20 of the first light emitting element 142. The third light emitting layer 31 may generate the light $L_{\lambda 2}$ of the second wavelength λ2 and have the same material and structure as the second light emitting layer 30 of the first light emitting element 142. That is, the third light emitting layer 31 may include a third lower clad layer 33, a third active layer 35 and a third upper clad layer 37. The third lower clad layer 33, the third active layer 35 and the third upper clad layer 37 may have the same materials and thicknesses as the second lower clad layer 32, the second active layer 34 and the second upper clad layer 36, respectively. The third active layer 35 may generate the light $L_{\lambda 2}$ of the second wavelength λ2 shorter than the first wavelength λ1 of the light $L_{\lambda 1}$ emitted from the first light emitting element 142 and having a difference in wavelength of about 50 nm or more from the first wavelength λ1. For example, the third active layer 35 may generate light in a visible light wavelength band.

The second etch stop layer 41 may have the same material and thickness as the first etch stop layer 40 of the first light emitting element 142.

An oxide aperture layer 61 may be disposed on the second etch stop layer 41. A second nanostructure reflective layer 95 and a second electrode 85 may be disposed on the oxide aperture layer 61.

The second reflective layer 21 and the second nanostructure reflective layer 95 may form a resonance cavity with respect to light generated in the third active layer 35. That is, the second reflective layer 21 and the second nanostructure reflective layer 95 may be provided to oscillate the light generated in the third active layer 35 and amplify and emit the light $L_{\lambda 2}$ of the second wavelength λ2. The thickness from the top of the second reflective layer 21 to the second nanostructure reflective layer 95 may be an integer n multiple of the second wavelength λ2. The integer n may be smaller than an integer m used to set a cavity length of the first light emitting element 142.

The second nanostructure reflective layer 95 may include a plurality of nanostructures NS2 having a sub-wavelength shape dimension. The sub-wavelength shape dimension is a dimension such as a thickness or a width defining the shape of the nanostructures NS2 being less than a wavelength of light emitted from the second light emitting element 148, i.e. the second wavelength λ2 that is a wavelength of light generated in the third active layer 35. As shown in FIG. 6, the nanostructures NS2 may be provided on a support layer 92.

The second nanostructure reflective layer 95 may include a semiconductor material. For example, the second nanostructure reflective layer 95 may be entirely formed of a III-V group semiconductor compound. Also, the composition of the compound may be adjusted to set the refractive index of the support layer 92 to be less than the refractive index of the nanostructures NS2. The refractive index difference between the support layer 92 and the nanostructures NS2 may be about 0.5 or greater, or about 1 or greater.

The thickness of the support layer 92 may be set to be equal to or greater than ⅕ of an emission wavelength, i.e., the second wavelength λ2.

The light $L_{\lambda 2}$ of the second wavelength λ2 may be emitted from the second light emitting element 148.

According to an example embodiment, the light $L_{\lambda 1}$ of the first wavelength λ1 emitted from the first light emitting element 142 and the light $L_{\lambda 2}$ of the second wavelength λ2 emitted from the second light emitting element 148 may have different polarizations.

The specific shapes of the second electrode 80 of the first light emitting element 142 and the second electrode 85 of the second light emitting element 148 may be adjusted to control the polarization of emitted light. That is, paths through which current is injected into the first active layer 54 and the third active layer 35 may be changed according to the shapes of the second electrodes 80 and 85, and the polarization of the emitted light may be different. For example, the shape of the second electrode 80 of the first light emitting element 142 and the shape of the second electrode 85 of the second light emitting element 148 may be different from each other such that the polarization of the light $L_{\lambda 1}$ of the first wavelength λ1 emitted from the first light emitting element 142 and the polarization of the light $L_{\lambda 2}$ of the second wavelength λ2 emitted from the second light emitting element 148 may be different from each other.

According to an example embodiment, an asymmetric current injection method may be used to adjust the polarization of the emitted light. The polarization of the emitted light may be adjusted by adjusting a direction in which current is injected or by adjusting an amount of injected current according to the direction. In this case, the shape of the second electrode 80 of the first light emitting element 142 and the shape of the second electrode 85 of the second light emitting element 148 may be the same.

According to an example embodiment, the polarization of the emitted light may be also adjusted by having the sectional shapes of the first light emitting element 142 and the second light emitting element 148 asymmetrical and adjusted in a long length direction. For example, in the perspective views of FIGS. 3A and 5A, the first light emitting element 142 and the second light emitting element 148 have a cylindrical shape, however, example embodiments are not limited thereto, and the first light emitting element 142 and the second light emitting element 148 may have, for example, a rectangular column shape with different lengths in the horizontal and vertical directions. In this regard, the first light emitting element 142 and the second light emitting element 148 may have different long length directions such that the polarization of the light $L_{\lambda 1}$ of the first wavelength λ1 emitted from the first light emitting element 142 and the polarization of the light $L_{\lambda 2}$ of the second wavelength λ2 emitted from the second light emitting element 148 may be different from each other.

According to an example embodiment, the polarization of the emitted light may be also adjusted by disposing a grating-based configuration as an element adjusting the polarization direction in a path in which light is emitted from each of the first light emitting element 142 and the second light emitting element 148. Different grating elements may be disposed in two paths respectively to emit light of different polarizations such that the polarization of the light $L_{\lambda 1}$ of the first wavelength λ1 emitted from the first light emitting element 142 and the polarization of the light $L_{\lambda 2}$ of the second wavelength λ2 emitted from the second light emitting element 148 may be different from each other.

Figure 7:
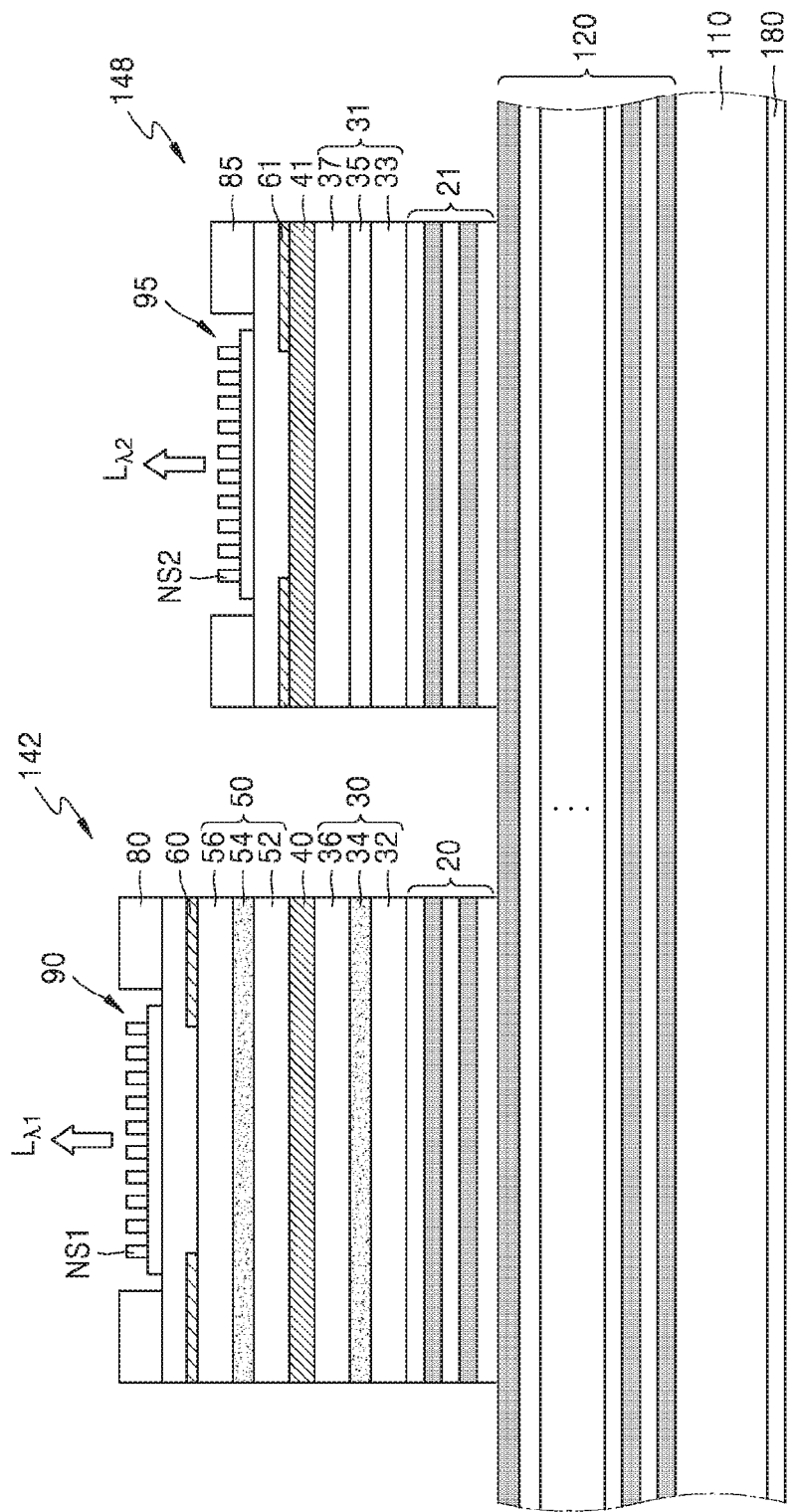
FIG. 7 is a detailed enlarged cross-sectional view showing a part of the light source device of FIG. 1

FIG. 7 is a detailed enlarged cross-sectional view showing a part of the light source device 100 of FIG. 1.

The first light emitting element 142 and the second light emitting element 148 included in the light source device 100 may share the lower electrode 180, the semiconductor substrate 110, and the reflective layer 120. Also, the first reflective layer 20, the second light emitting layer 30 and the first etch stop layer 40 of the first light emitting element 142 may have the same materials and structures as the second reflective layer 21, the third light emitting layer 31 and the second etch stop layer 41 of the second light emitting element 148, respectively. Accordingly, the first light emitting element 142 and the second light emitting element 148 may share many processes of forming the first light emitting element 142 and the second light emitting element 148. For example, when material layers constituting the reflective layer 120 and the first light emitting element 142 are stacked on the semiconductor substrate 110, and then the pattern of the second light emitting element 148 is formed, the second etch stop layer 41 may be utilized to remove material layers unnecessary for the second light emitting element 148. As described above, a process of forming the second light emitting element 148 may mostly utilize a process of forming the first light emitting element 142, which is more easy to manufacture.

Figure 8A:
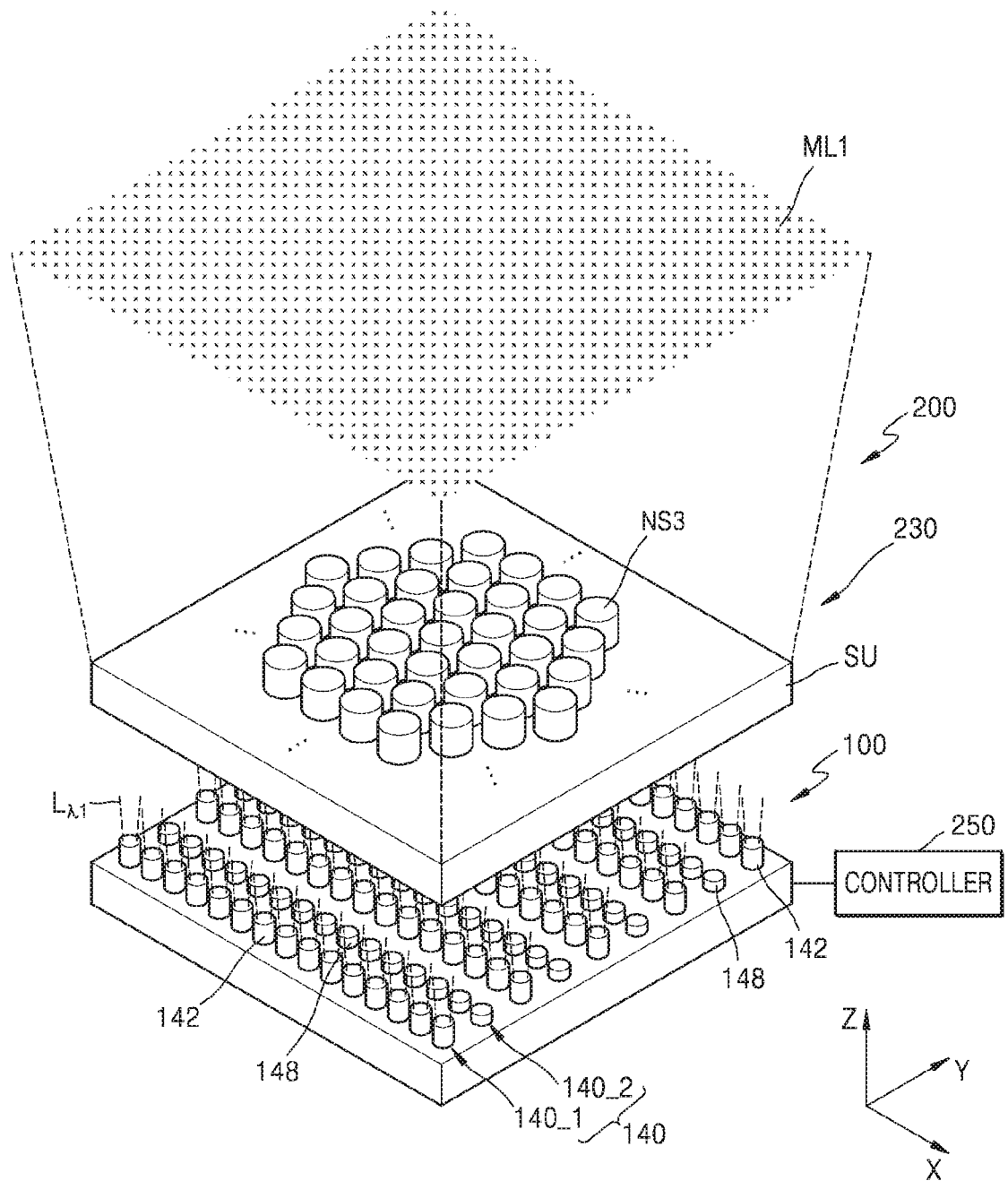
FIGS. 8A and 8B are perspective views of a multi-function projector according to an example embodiment and respectively show forming of first modulation light from light of a first light emitting element and second modulation light from light of a second light emitting element.
Figure 8B:
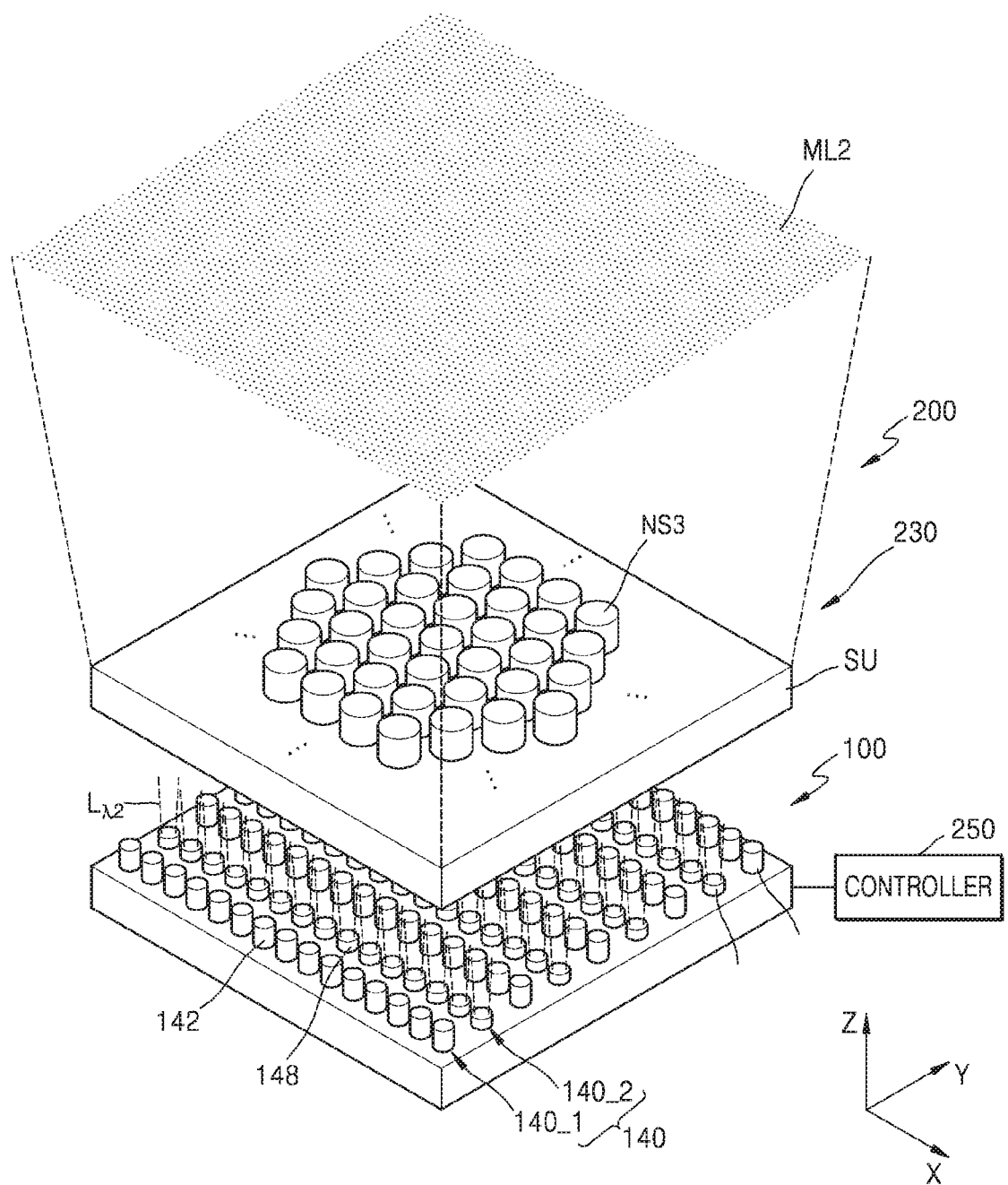

FIGS. 8A and 8B are perspective views of a multi-function projector 200 according to an example embodiment and respectively show forming first modulation light ML1 from light of the first light emitting element 142 and second modulation light ML2 from light of the second light emitting element 148.

The multi-function projector 200 may include the light source device 100, a controller 250, and a nanostructure light modulation layer 230.

The light source device 100 may include the light source array 140 that emits light of a plurality of wavelengths. The light source array 140 includes the first light emitting element 142 emitting the light $L_{\lambda 1}$ of the first wavelength λ1 and the second light emitting element 148 emitting the light $L_{\lambda 2}$ of the second wavelength λ2. The first light emitting element 142 may be repeatedly arranged along rows spaced apart from each other to form the first light emitting array 140_1. The second light emitting element 148 may be repeatedly arranged along rows alternating the rows of the first light emitting array 140_1 to form the second light emitting array 140_2.

The controller 250 may control the light source device 100 such that the first light emitting element 142 or the second light emitting element 148 is selectively driven. For example, as shown in FIG. 8A, when only the first light emitting elements 142 are driven to emit light and the second light emitting elements 148 are controlled to be off and not to emit light, the light source device 100 may emit the light $L_{\lambda 1}$ of the first wavelength λ1. As shown in FIG. 8B, when only the second light emitting elements 148 are driven to emit light and the first light emitting element 142 is controlled to be off and not to emit light, the light source device 100 may emit the light $L_{\lambda 2}$ of the second wavelength λ2.

The nanostructure light modulation layer 230 may be a layer that is disposed in a path of light emitted from the light source device 100 and modulates the light. The nanostructure light modulation layer 230 may include a plurality of nanostructures NS3 having a sub-wavelength shape dimension smaller than the wavelength of the light emitted from the light source device 100.

The nanostructure light modulation layer 230 may include the plurality of nanostructures NS3. The nanostructures NS3 have a sub-wavelength shape dimension. Herein, the shape dimension refers to a dimension defining the shape of the nanostructures NS3 such as a thickness and a width, the sub-wavelength shape dimension is at least one of such shape dimensions being smaller than the wavelength of light emitted from the light source device 100. The light source device 100 may emit the light $L_{\lambda1}$ of the first wavelength $\lambda1$ or the light $L_{\lambda2}$ of the second wavelength $\lambda2$ shorter than the first wavelength $\lambda1$. The nanostructures NS3 may have the sub-wavelength shape dimension with respect to the second wavelength $\lambda2$.

The shape dimension of the nanostructures NS3 may be equal to or less than half of the second wavelength $\lambda2$. The arrangement pitch of the nanostructures NS3 may be equal to or less than half of the second wavelength $\lambda2$. When the width of the nanostructures NS3 is equal to or less than half of a wavelength of incident light, the nanostructures NS3 may operate as strong scattering units that form a metastructure. As the arrangement pitch of the nanostructures NS3 becomes smaller than the wavelength of incident light, the incident light may be controlled to have an intended shape without higher-order diffraction.

Each of the nanostructures NS3 may have unique transmission intensity and transmission phase depending on the material and shape thereof. The phase or intensity distribution of light passing through the nanostructure light modulation layer 230 may be controlled by adjusting the shape distribution of the nanostructures NS3. The shape distribution refers to at least any one of the shape, the size, the size distribution, the arrangement pitch, and the arrangement pitch distribution of the nanostructures NS3.

The shape distribution of the nanostructures NS3 may be determined such that different transmission phase distributions may be formed depending on the polarization of light emitted from the light source device 100. Accordingly, the nanostructure light modulation layer 230 may modulate the light $L_{\lambda1}$ of the first wavelength $\lambda1$ emitted from the first light emitting elements 142 into the first modulation light ML1 and the light $L_{\lambda2}$ of the second wavelength $\lambda2$ emitted from the second light emitting elements 148 into the second modulation light ML2.

According to an example embodiment, when the light $L_{\lambda1}$ of the first wavelength $\lambda1$ and the light $L_{\lambda2}$ of the second wavelength $\lambda2$ emitted from light source device 100 have first polarization and second polarization, respectively, the shape distribution of the nanostructures NS3 may be determined such that the light $L_{\lambda1}$ of the first wavelength $\lambda1$ emitted from the first light emitting elements 142 in a first polarization state may be modulated as structured light, and the light $L_{\lambda2}$ of the second wavelength $\lambda2$ emitted from the second light emitting elements 148 in a second polarization state may be modulated as uniform light. In other words, the first modulation light ML1 may be the structured light, and the second modulation light ML2 may be the uniform light.

The structured light refers to a distribution of beam spots formed by rays of light propagating in a space. The structured light generated while passing through the nanostructure light modulation layer 230 may have a pattern mathematically coded to uniquely designate angular position coordinates with bright and dark points. The pattern may be used to recognize a three-dimensional shape. The structured light cast on a three-dimensional object may be changed in shape by the three-dimensional object, and this change may be imaged using an imaging device such as a camera to extract depth information of the three-dimensional object by tracing the degree of variation in pattern shape according to coordinates.

The uniform light may be illumination light that does not have a pattern that structured light has according to positions. Light emitted from the light source device 100 may be adjusted in beam width and become uniform in spatial distribution while passing through the nanostructure light modulation layer 230. For example, the uniform light may have illuminance for obtaining two-dimensional images, or may be used as illumination light.

Although all the nanostructures NS3 are illustrated as having a circular cylindrical form with the same shape, size, and height, this is an example and example embodiments are not limited thereto. For example, the horizontal or vertical size or material of the nanostructures NS may be adjusted according to the positions of the nanostructures NS3 to obtain an intended transmission intensity distribution or transmission phase distribution. To obtain an intended transmission intensity distribution or transmission phase distribution, the shape distribution of a group of a plurality of nanostructures NS3 may be determined according to the positions of the nanostructures NS3. Also, such groups of nanostructures NS3 may be repeatedly arranged at a predetermined period. The shape distribution of the nanostructures NS3 may be regular, periodic, or quasi-periodic. However, the shape distribution of the nanostructures NS3 is not limited thereto. For example, the shape distribution of the nanostructures NS3 may be random.

The nanostructure light modulation layer 230 may further include a support layer SU supporting the nanostructures NS3. The support layer SU may include a material having a refractive index less than that of the nanostructures NS3. For example, the support layer SU may include silicon dioxide ($SiO_2$), a transparent conductive oxide (TCO), or a polymer such as polycarbonate (PC), polystyrene (PS), or polymethylmethacrylate (PMMA).

The nanostructures NS3 may include a dielectric material. The nanostructures NS3 may include a material having a higher refractive index than the refractive index of an adjacent material such as air or the support layer SU. The difference between the refractive index of the nanostructures NS3 and the refractive index of the adjacent material may be 1 or greater.

The nanostructures NS3 may include any one of single crystal silicon, polycrystalline silicon (poly Si), amorphous silicon, silicon nitride ($Si_3N_4$), gallium phosphide (GaP), titanium dioxide ($TiO_2$), aluminium antimonide (AlSb), aluminium arsenide (AlAs), AlGaAs, AlGaInP, boron phosphide (BP), and zinc germanium phosphide ($ZnGeP_2$).

According to an example embodiment, the nanostructures NS3 may include a conductive material. The conductive material may be a highly conductive metallic material capable of surface plasmon excitation. For example, the nanostructures NS may include at least any one selected from copper (Cu), aluminum (Al), nickel (Ni), iron (Fe), cobalt (Co), zinc (Zn), titanium (Ti), ruthenium (Ru), rhodium (Rh), palladium (Pd), platinum (Pt), silver (Ag), osmium (Os), iridium (Ir), and gold (Au), or the nanostructures NS3 may include an alloy including any one of the listed elements. Also, the nanostructures NS3 may include a highly conductive two-dimensional material such as graphene, or a conductive oxide.

According to an example embodiment, some of the nanostructures NS3 may include a dielectric material having a high refractive index, and some of the nanostructures NS3 may include a conductive material. That is, some of the nanostructures NS3 may include a dielectric material having a refractive index greater than the refractive index of the support layer SU, and the other nanostructures NS3 may include a conductive material.

The nanostructures NS3 may have an asymmetric shape. When the nanostructures NS3 having asymmetry in shape are employed, the above-described optical operations may be performed on light polarized in a particular direction according to asymmetry. In other words, the transmission phase distribution of light incident on each of the nanostructures NS3 may be varied such that structured light may be obtained from light having the first polarization state, and uniform light may be obtained from light having the second polarization state.

The cross-sectional shape of the nanostructures NS3 may be asymmetrical. That is, the shape of cross-sections of the nanostructures NS3 perpendicular to a direction (Z-axis direction) in which the light source device 100 and the nanostructure light modulation layer 230 are spaced apart from each other may have asymmetry. For example, the nanostructures NS3 may have different lengths in two polarization directions when the first polarization and the second polarization of light respectively emitted from the first light emitting element 142 and the second light emitting element 148 are different from each other. The degree of difference between the two polarization directions may vary according to a position of each of the nanostructures NS3. For example, the arrangement and distribution of the nanostructures NS3 may be determined by adjusting the direction length of the first polarization of the light emitted from the first light emitting element 142 to form a predetermined structured light pattern using the light having the first polarization, and similarly adjusting the length distribution of the second polarization of the nanostructures NS3 to provide uniform illumination by mixing the light having the second polarization emitted from the second light emitting element 148. For example, the nanostructures NS3 may be designed to have a phase grating effect such that light having the first polarization direction may be diffracted at periodic angles to form a structured light pattern. The nanostructures NS3 may be designed to have a phase distribution like an aspherical convex lens such that light having the second polarization direction may form uniform illumination light. The direction length of the first polarization and the direction length of the second polarization of the nanostructures NS3 may be determined at each position by simulating the influences of the lengths in the two directions.

Figure 9:
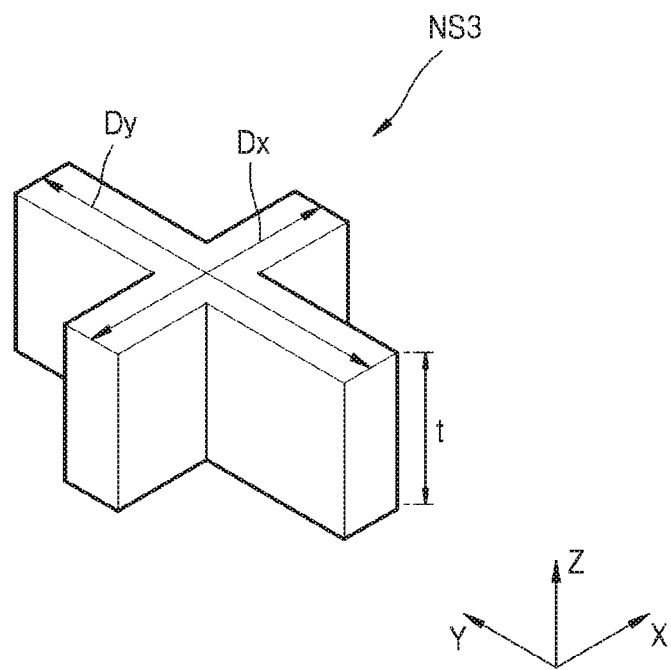
FIGS. 9 to 11 are perspective views illustrating example shapes of nanostructures that may be included in a nanostructure light modulation layer of FIGS. 8A and 8B.
Figure 10:
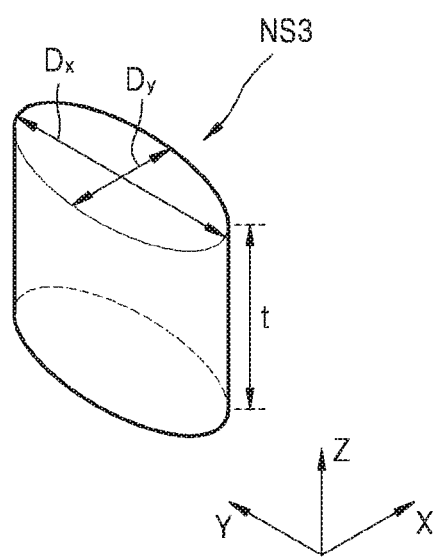
Figure 11:
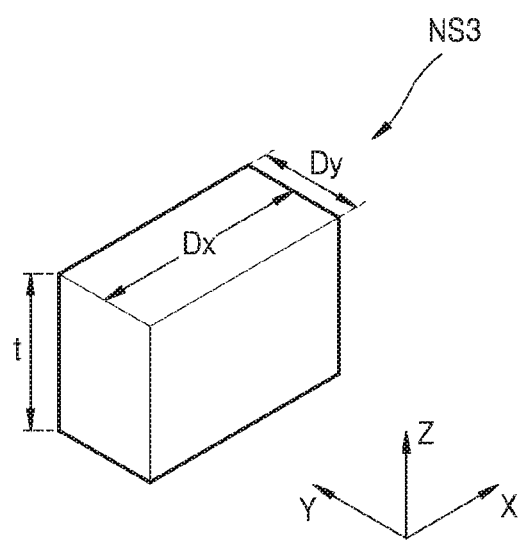

FIGS. 9 to 11 are perspective views illustrating example shapes of the nanostructures NS3 that may be included in the nanostructure light modulation layer 230 of FIGS. 8A and 8B.

Referring to FIG. 9, the nanostructure NS3 may have a polygonal pillar shape with a cross-shaped section parallel to an XY plane and a thickness (t). The cross-sectional shape may be an asymmetric shape with an X-axis length Dx being different from a Y-axis length Dy. The ratio of the X-axis length Dx and the Y-axis length Dy of the cross shape may vary according to the positions of nanostructures NS3. Also, the distribution of X-axis lengths Dx and the distribution of Y-axis lengths Dy of nanostructures NS3 may be different. For example, the distribution of X-axis lengths Dx may be determined to form patterned light, and the distribution of Y-axis lengths Dy may be determined to form uniform light. Such asymmetrically-shaped nanostructures NS3 may be arranged at positions to have different effects on light polarized in the X-axis direction and light polarized in the Y-axis direction.

Referring to FIG. 10, the nanostructure NS3 may have an asymmetric elliptical pillar shape with a cross-section parallel to an XY plane being elliptical. The nanostructure NS3 may have an elliptical shape with a major-axis length $D_L$ being different from a minor-axis length Ds, and the ratio of the major-axis length $D_L$ and the minor-axis length Ds of such nanostructures NS3 may be varied according to the positions of the nanostructures NS3 to have different optical effects on light polarized in a direction parallel to the major axis and light polarized in a direction parallel to the minor axis.

Referring to FIG. 11, the nanostructure NS3 may have an asymmetric rectangular parallelepiped shape having a rectangular cross-section with a length $D_x$ and a width $D_y$. As in the case shown in FIGS. 4 and 6, the aspect ratio of the rectangular cross-section may be adjusted according to positions of the nanostructure NS3 to have different optical effects on light polarized in the X-axis direction and light polarized in the Y-axis direction.

Figure 12:
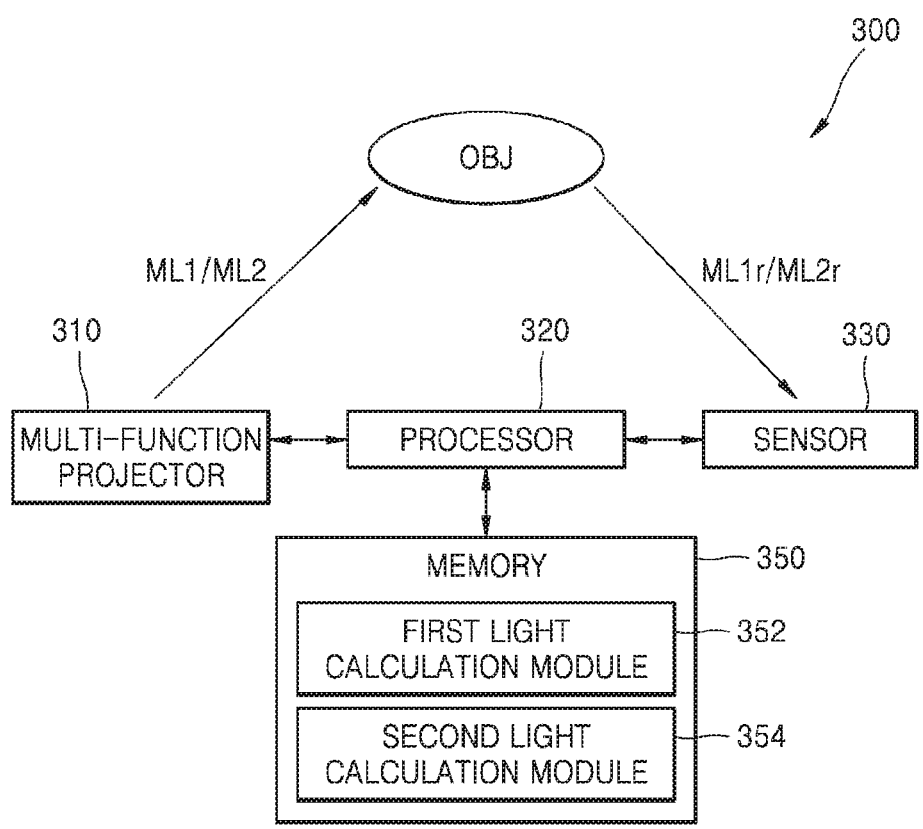
FIG. 12 is a block diagram schematically illustrating an electronic device according to an example embodiment.

FIG. 12 is a block diagram schematically illustrating an electronic device 300 according to an embodiment.

The electronic device 300 may include a multi-function projector 310 configured to emit light onto an object OBJ, a sensor 330 configured to receive light reflected from the object OBJ, and a processor 320 configured to perform calculations to obtain information about the shape of the object OBJ from the light that the sensor 330 has received.

The multi-function projector 310 may include a light source array emitting light of a plurality of wavelengths and a nanostructure light modulation layer having different modulation functions with respect to the light having of the plurality of wavelengths and may selectively irradiate the first modulation light ML1 or the second modulation light ML2 onto the object OBJ. The first modulation light ML1 and the second modulation light ML2 may be structured light and uniform light respectively. The multi-function projector 200 described with reference to FIGS. 8A and 8B may be employed as the multi-function projector 310.

The processor 320 may perform overall control on the electronic device 300. For example, the processor 320 may control the multi-function projector 310 to radiate the object OBJ with the first modulation light ML1 or the second modulation light ML2. Also, the processor 320 may control the operation of the sensor 330 and receive information about light ML1r and ML2r received by the sensor 330, and perform calculations using the received light ML1r and ML2r. The processor 320 may perform other calculations according to the wavelength of the light emitted from the multi-function projector 310. For example, when the multi-function projector 310 emits the first modulation light ML1, the processor 320 may perform a calculation for analysis of the light ML1r received by the sensor 330, and when the multi-function projector 310 emits the second modulation light ML2, the processor 320 may perform a calculation for analysis of the light ML2r received by the sensor 330. For example, when the first modulation light ML1 is the structured light, the processor 320 may perform a calculation for obtaining a three-dimensional shape of the object OBJ, and when the second modulation light ML2 is the uniform light, the processor 320 may perform a calculation for obtaining a two-dimensional shape of the object OBJ.

The electronic device 300 may include a memory 350. A first light calculation module 352 and a second light calculation module 354 programmed to be executed on the processor 320 may be stored in the memory 350. The first light calculation module 352 and the second light calculation module 354 may be applications related to the first modulation light ML1 and the second modulation light ML2, respectively.

The processor 320 may control the multi-function projector 310 to emit the first modulation light ML1 by executing the first light calculation module 352 stored in the memory 350 and may analyze the light ML1r received by the sensor 330. For example, when the first modulation light ML1 is the structured light, the processor 320 may analyze a pattern variation of the structured light to analyze information about the three-dimensional shape of the object OBJ.

The processor 320 may control the multi-function projector 310 to emit the second modulation light ML2 by executing the second light calculation module 354 stored in the memory 350 and may analyze the light ML2r received by the sensor 330. For example, when the second modulation light ML2 is the uniform light, the processor 320 may analyze information about the two-dimensional shape of the object OBJ.

Figure 13:
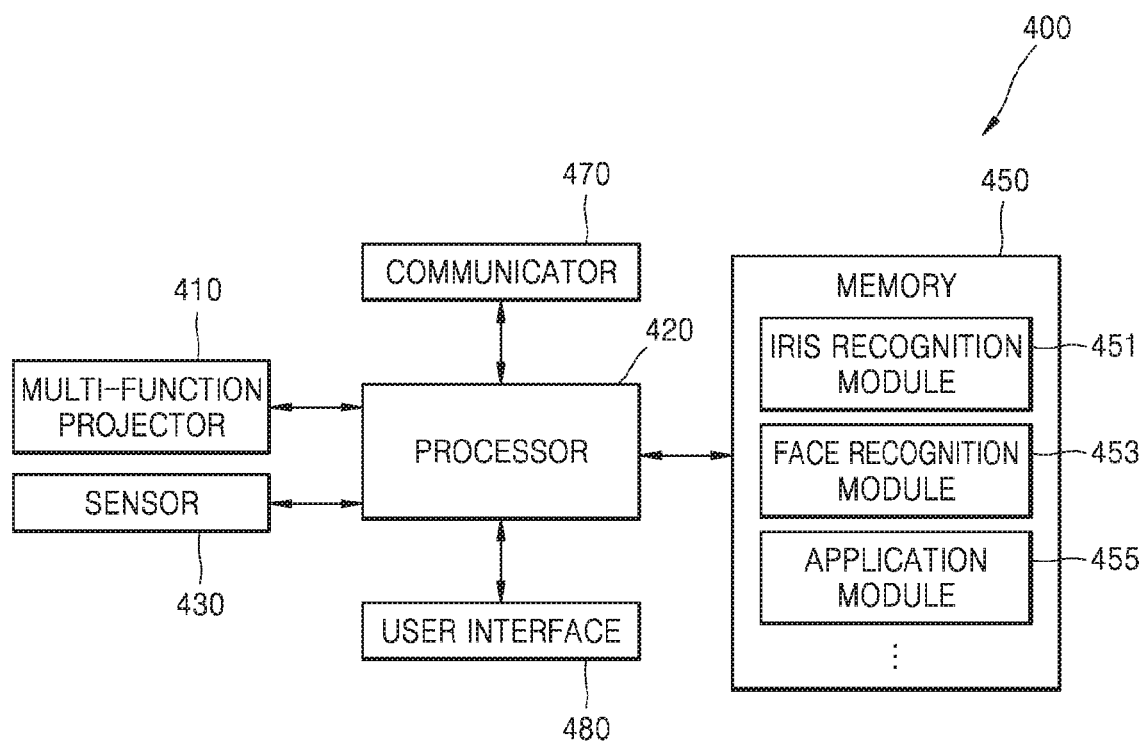
FIG. 13 is a block diagram schematically illustrating an electronic device according to an example embodiment.

FIG. 13 is a block diagram schematically illustrating an electronic device 400 according to an example embodiment.

The electronic device 400 may include a multi-function projector 410 configured to emit light onto an object for performing user authentication, a sensor 430 configured to receive light reflected from the object, and a processor 420 configured to analyze the light incident on the sensor 430 to determine whether to authenticate a user.

The multi-function projector 200 described with reference to FIGS. 8A and 8B may be employed as the multi-function projector 410. The multi-function projector 410 may include a light source array configured to emit light of a plurality of wavelengths and a nanostructure light modulation layer having different modulation functions with respect to the light of the plurality of wavelengths. The multi-function projector 410 may selectively emit structured light or uniform light toward the object. The object onto which light is emitted for user authentication may be the face of the user or the iris of a user's eye.

The processor 420 may control the multi-function projector 410 according to a user input or an input according to execution of an application included in the electronic device 400.

When the multi-function projector 410 emits the structured light onto the object, the processor 420 may use a face recognition method for authentication. When the multi-function projector 410 emits the uniform light onto the object, the processor 420 may use an iris recognition method for authentication.

The electronic device 400 may include a memory 450. An iris recognition module 451, a face recognition module 453, and an application module 455 that are programmed to be executed by the processor 420 may be stored in the memory 450. Also, data for executing the iris recognition module 451, the face recognition module 453, and the application module 455 may be stored in the memory 450.

The processor 420 may execute the face recognition module 453 in response to a signal input by a user or the application module 455. Then, the processor 420 may accordingly control the multi-function projector 410 to emit the structured light and may analyze light incident on the sensor 430 by a three-dimensional analysis method to recognize the face of the user. Analyzed facial data may be compared with facial data previously stored in the memory 450 to determine whether to authenticate the user.

The processor 420 may execute the iris recognition module 451 in response to a signal input by a user or the application module 455. Then, the processor 420 may accordingly control the multi-function projector 410 to emit the uniform light and may analyze light incident on the sensor 430 to recognize the iris of a user's eye. Analyzed iris data may be compared with iris data previously stored in the memory 450 to determine whether to authenticate the user.

Also, the memory 450 may further store modules, such as a communication module, a camera module, a video replay module, or an audio replay module, as programs for operating devices included in the electronic device 400.

The memory 450 may include at least one type of recording medium selected from a flash memory, a hard disk, a micro multimedia card, a memory card (e.g., a secure digital (SD) card or an extreme digital (XD) card, random access memory (RAM), static random access memory (SRAM), read-only memory (ROM), electrically erasable programmable read-only memory (EEPROM), programmable read-only memory (PROM), a magnetic memory, a magnetic disk, or an optical disk.

Also, the electronic device 400 may further include a communicator 470 and a user interface 480.

The communicator 470 may communicate with external devices by a method such as Bluetooth communication, Bluetooth low energy (BLE) communication, near field communication, wireless local area network (WLAN) communication, ZigBee communication, infrared data association (IrDA) communication, Wi-Fi direct (WFD) communication, ultra wideband (UWB) communication, Ant+ communication, or Wi-Fi communication. However, the communicator 470 is not limited thereto.

The user interface 480 may include a display panel, a keyboard, a touch panel, or buttons.

In an example embodiment, the electronic device 400 may be a portable mobile communication device, a smart phone, a smart watch, a personal digital assistant (PDA), a laptop, a personal computer (PC), a smart refrigerator, a mobile computing device, or a non-mobile computing device. However, the electronic device 400 is not limited thereto.

In the above example embodiments, methods embodied as software modules or algorithms in the electronic device 400 may be stored on a computer-readable recording medium as non-transitory computer-readable codes or program commands executable by the processor 420. Examples of the computer-readable recording medium include, but are not limited to, magnetic storage media (e.g., ROM, RAM, floppy disks, hard disks, etc.), optical recording media (e.g., CD-ROMs, or DVDs), and the like. The computer-readable recording medium may also be distributed over network-coupled computer systems so that the computer-readable codes may be stored and executed in a distributed fashion. The medium may be read by a computer, stored in a memory, and executed by a processor.

As described above, according to the one or more of the above example embodiments, the multi-wavelength light source device may selectively emit light of different wavelength bands.

The multi-wavelength light source device may be monolithically formed on one substrate, which is easier to manufacture.

The multi-wavelength light source device may be used to implement a multi-function projector along with a nanostructure light modulation layer and may be employed in an electronic device for various applications.

It should be understood that the embodiments described herein should be considered in a descriptive sense only and not for purposes of limitation. Descriptions of features or aspects within each embodiment should typically be considered as available for other similar features or aspects in other embodiments.

While the multi-function projector and the electronic device including the multi-function projector have been described according to example embodiments with reference to the figures, it will be understood by those of ordinary skill in the art that various changes in form and details may be made therein without departing from the spirit and scope as defined by the following claims.

What is claimed is:

1. A light source device comprising:
   a substrate;
   a light source array disposed on the substrate, the light source array comprising a first light emitting element and a second light emitting element spaced apart from the first light emitting element,
   wherein the first light emitting element comprises:
      a first reflective layer;
      a second light emitting layer configured to emit light of a second wavelength;
      a first etch stop layer;
      a first light emitting layer configured to emit light of a first wavelength, the first wavelength being different from the second wavelength; and
      a first nanostructure reflective layer, the first reflective layer and the first nanostructure reflective layer forming a resonance cavity with respect to light of the first wavelength generated in the first light emitting layer, and
   wherein the second light emitting element comprises:
      a second reflective layer having same material and thickness as the first reflective layer;
      a third light emitting layer having same material and structure as the second emitting layer, the third light emitting layer being configured to generate light of the second wavelength;
      a second etch stop layer having same material and thickness as the first etch stop layer; and
      a second nanostructure reflective layer, the second nanostructure reflective layer and the second reflective layer forming a resonance cavity with respect to light of the second wavelength generated in the third light emitting layer.

2. The light source device of claim 1, wherein the light source device has a monolithic structure.

3. The light source device of claim 1, wherein the first wavelength is greater than the second wavelength.

4. The light source device of claim 1, wherein each of the first light emitting layer and the second light emitting layer has a quantum well structure, respectively,
   wherein a band gap energy of the quantum well structure of the first light emitting layer is less than a band gap energy of the quantum well structure of the second light emitting layer.

5. The light source device of claim 1, wherein the first light emitting element is configured to emit the light of the first wavelength based on a distance between the first reflective layer and the first nanostructure reflective layer.

6. The light source device of claim 1, wherein a distance between the first reflective layer and the first nanostructure reflective layer is a first integer multiple of the first wavelength.

7. The light source device of claim 6, wherein a distance between the second reflective layer and the second nanostructure reflective layer is a second integer multiple of the second wavelength.

8. The light source device of claim 7, wherein the first integer is greater than the second integer.

9. The light source device of claim 1, wherein a difference between the first wavelength and the second wavelength is 50 nm or more.

10. The light source device of claim 1,
    wherein the first wavelength is in an infrared wavelength band, and
    wherein the second wavelength is in a visible light wavelength band.

11. The light source device of claim 1, wherein the first light emitting element and the second light emitting element emit lights of different polarizations, respectively.

12. The light source device of claim 1, wherein the first nanostructure reflective layer comprises a plurality of first nanostructures having a shape with sub-wavelength dimensions with respect to the first wavelength, the sub-wavelength being less than the first wavelength.

13. The light source device of claim 1, wherein the second nanostructure reflective layer comprises a plurality of second nanostructures having a shape with sub-wavelength dimensions with respect to the light of the second wavelength, the sub-wavelength being less than the second wavelength.

14. The light source device of claim 1,
    wherein the first light emitting element is disposed along a first plurality of rows spaced apart from and parallel with each other, and
    wherein the second light emitting element is disposed along a second plurality of rows, the second plurality of rows alternating with the first plurality of rows.

15. A multi-function projector comprising:
    the light source device of claim 1;
    a controller configured to control the light source device to selectively drive the first light emitting element or the second light emitting element; and
    a nanostructure light modulation layer disposed on an optical path of light emitted from the light source device, comprising a plurality of nanostructures having a shape with sub-wavelength dimensions, the sub-wavelength being less than a wavelength of the light emitted from the light source device, the nanostructure light modulation layer being configured to modulate the light emitted from the light source device.

16. The multi-function projector of claim 15, wherein the nanostructure light modulation layer is configured to modulate light emitted from the first light emitting element differently from light emitted from the second light emitting element.

17. The multi-function projector of claim 15, wherein the first light emitting element and the second light emitting element are configured to emit lights of different polarizations, respectively.

18. The multi-function projector of claim 17, wherein the nanostructure light modulation layer is configured to modulate light emitted from the first light emitting element into predetermined structured light, and modulate light emitted from the second light emitting element into uniform light.

19. The multi-function projector of claim 17, wherein the plurality of nanostructures of the nanostructure light modulation layer have asymmetrical cross-sectional shapes.

20. An electronic device comprising:
- the multi-function projector of claim 15, wherein the multi-function projector is configured to emit light to an object;
- a sensor configured to receive light reflected from the object; and
- a processor configured to determine shape information of the object based on the light received by the sensor.

21. The electronic device of claim 20, wherein the processor is configured to perform different determinations based on a wavelength of the light emitted from the multi-function projector.

22. The electronic device of claim 20, wherein the multi-function projector is configured to emit structured light onto the object based on the light emitted from the first light emitting element and to emit uniform light onto the object based on the light emitted from the second light emitting element.

23. The electronic device of claim 22, wherein the processor is configured to use a face recognition method for user authentication based on the multi-function projector emitting the structured light onto the object, and use an iris recognition method for user authentication based on the multi-function projector emitting the uniform light onto the object.

* * * * *